United States Patent [19]

Ainsworth et al.

[11] Patent Number: 4,860,442
[45] Date of Patent: Aug. 29, 1989

[54] METHODS FOR MOUNTING COMPONENTS ON CONVOLUTED THREE-DIMENSIONAL STRUCTURES

[75] Inventors: Roger W. Ainsworth, Oxford; John L. Allen, Eynsham, both of England; Anthony D. Kurtz, Teaneck, N.J.

[73] Assignee: Kulite Semiconductor, Leonia, N.J.

[21] Appl. No.: 276,879

[22] Filed: Nov. 28, 1988

[51] Int. Cl.[4] .............................................. H05K 3/30
[52] U.S. Cl. ...................................... 29/8.32; 29/830; 174/68.5; 264/61; 361/401; 361/406; 361/414
[58] Field of Search ...................... 361/401, 406, 414; 29/830, 832; 264/61; 174/68.5; 428/901

[56] References Cited

U.S. PATENT DOCUMENTS

| | | | |
|---|---|---|---|
| 3,739,232 | 6/1973 | Grossman et al. | 361/401 |
| 4,294,009 | 10/1981 | Quintin et al. | 29/832 |
| 4,320,438 | 3/1982 | Ibrahim et al. | 361/401 |
| 4,539,622 | 9/1985 | Akasaki | 264/61 X |
| 4,630,172 | 12/1986 | Stenerson et al. | 361/401 X |
| 4,682,414 | 7/1987 | Butt | 29/832 X |

Primary Examiner—Timothy V. Eley
Assistant Examiner—Carl J. Arbes
Attorney, Agent, or Firm—Arthur L. Plevy

[57] ABSTRACT

There is disclosed a method of mounting a pressure transducer on a convoluted three-dimensional structure as for example a turbine blade. The method first forms a groove on a surface of a blade. The groove is formed at a given length and depth in order to accommodate a plurality of components. The groove is then filled with a ceramic material so that the top of the groove is aligned with the top surface of the structure. The entire structure is then coated with a first layer of a ceramic material which layer also covers the filled groove. Suitable conductors are then placed on the coated surface so that they span and overlie the groove. The structure is then coated with a second layer of ceramic material and the coating covers the conductors thereby serving to embed the conductors between the first and second layers. A second groove is then formed in the first and second layers which second groove overlies the first groove and which extends into the first groove. The formation of the second groove operates to separate or cut the conductors as overlying the first groove. Then ceramic material from the second layer is removed on each side of the second groove to expose the separated end surfaces of the conductors. The pressure transducer which is an integrated circuit is then placed into the second groove, and one now bonds the component terminals of the pressure transducer to the exposed conductor surfaces. In this manner both the wires leading from the transducer and the transducer itself are beneath the surface of the structure and do not interfere with the surface contours of the structure while further allowing testing of the same in all operating environments.

20 Claims, 2 Drawing Sheets

METHODS FOR MOUNTING COMPONENTS ON CONVOLUTED THREE-DIMENSIONAL STRUCTURES

BACKGROUND OF THE INVENTION

This invention relates to apparatus and methods for mounting components on three-dimensional structures and more particularly to apparatus and methods for mounting pressure transducers or similar transducers on convoluted three-dimensional structures such as turbine blades As one can ascertain from the prior art, there are many complicated mechanical devices which essentially are subjected to high velocities or high rotational speeds during operation. A particularly good example of one such device is the turbine blade.

Turbine blades are utilized in a wide variety of applications and apparatus such as in engines, pumps and so on. Prior to the incorporation of such a blade in an operating system, the engineer typically makes measurements concerning the aerodynamic performance of the blade during various operating conditions. These testing and measurement procedures are often- times complicated and difficult to perform. In the case of a turbine blade or other device which is subjected to high speed operation and which device is essentially a complex shape, one has to assure that the surface contours of the device are not changed by the mounting of various test components on the device and that such mounting would be suitable to the extremely high G forces encountered under test conditions.

This is particularly important in regard to turbine blades whereby such a blade may be subjected to very high velocities and during test procedures, the surface contours of the blade must not be changed in order for the engineer to determine that the blade exhibits proper aerodynamic operation according to the mechanical design.

In any event, in order to provide such testing, various components such as pressure transducers, accelerometers and so on are mounted on the blade. The outputs of these devices are then monitored to determine operating characteristics during the various conditions that the blade would be exposed to during normal operation. It is, of course, apparent that based on the highly convoluted three-dimensional structure of such a blade, the basic form of the blade must be maintained in order for the designer to assure that the blade as designed will operate according to specifications.

Thus, according to prior art techniques various testing components such as pressure transducers, accelerometers and other devices were mounted directly on the surface of the blade. These devices, of course, occupy a given volume, and hence the devices as well as the wires connecting these devices to the testing apparatus protruded from the surfaces of the blade. This essentially changed the blade profile, and hence the tests were not really indicative of the true operation of the blade.

As one can understand, the turbine blade is given as an example of a particular device which essentially possesses convoluted three-dimensional surfaces. It is apparent that there are many other devices which are utilized for example in engines and so on which also require testing during operation and which also cannot have their profiles disturbed by the mounting of various test components on the surfaces of the device.

It is, of course, apparent that all components which are mounted in conjunction with testing procedures on such convoluted surfaces such as pressure transducers and the accompanying connecting wires are subjected to extremely high gravitational forces during operation. Hence, it would be extremely desirable to provide a method and apparatus for testing such convoluted three-dimensional structures without upsetting the design profile of such structures.

It would be a further object to provide a means of mounting test components such as pressure transducers on the surface of such devices while maintaining the exact profile and while further assuring that there are no projecting wires or component surfaces which would otherwise disturb the aerodynamic properties of such a device.

BRIEF DESCRIPTION OF THE PREFERRED EMBODIMENT

A method for mounting components on a convoluted three-dimensional structure, comprising the steps of forming a groove on a surface of said structure, coating said structure including said groove with a first layer of ceramic material, placing conductors on said first layer of ceramic material so that they overlie and span said groove, coating said structure including said first layer and conductors with a second layer of ceramic material to embed said conductors between said first and second layers, forming a second groove in said first and second layers which overlies said first groove and which extends into the same to separate said conductors at a point at which they overlie said first groove, removing ceramic material from said second layer on each side of said second groove to expose the separated end surfaces of said conductor, placing a component having terminals within said second groove and bonding said component terminals to said exposed conductor surfaces.

DETAILED DESCRIPTION OF THE FIGURES

Figure 1:
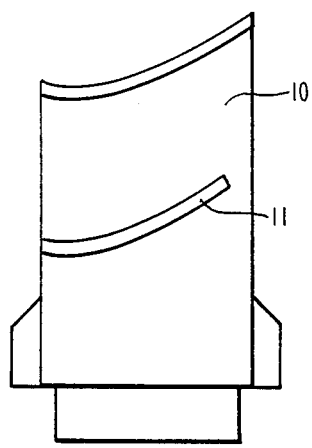
FIG. 1 is a plan view depicting a turbine blade which is useful in describing this invention.

Referring to FIG. 1, there is shown an example of a turbine blade.

While FIG. 1 shows a turbine blade structure, it is immediately understood that the method and apparatus to be described will relate to any structure which essentially is a convoluted three-dimensional structure and which structure is subjected to high speeds of operation such as engine parts and so on.

Thus, as one will understand, the present technique relates to the mountinq of test components such as pressure transducers on any metallic surface whereby the turbine blade 10 is typical of the type of structures that are subjected to these tests As one can ascertain, turbines are utilized in a wide variety of applications such as in steam turbines, gas turbines, water turbines, engines and so on. Such devices are subjected to high speeds of operation and essentially possess unique surface contours which are relatively complicated and designed to reduce friction and to obtain adequate thrusts and so on.

As one can see from FIG. 1, the typical blade 10 is a relatively complicated three-dimensional structure. In any event, it would be desirable prior to producing such a blade to fabricate a prototype and to test the prototype under various field conditions. After such testing, one can then assure that the blade will operate as designed.

In order to perform such testing, the prior art employed various devices such as pressure transducers, accelerometers and other types of testing devices which devices are mounted directly on the surfaces of the blade. As is indicated above, these components would protrude from the surface and hence absolutely disturb the design profile of the blade or of the article to be tested.

It is also understood that such test components were also associated with wires or conductors which wires or conductors were directed through various devices such as slip rings and so on to testing equipment. These wires also would protrude from the surface of the device to be tested and were also subjected to extremely high gravitational forces during testing procedures. In such testing it is extremely desirable to accommodate the testing procedures by mounting as many pressure devices on the surfaces of the turbine blade as can be accommodated. In this manner one would have a full and a complete understanding of the various pressures or forces exerted on the blade during operation.

Hence, it would be a desire to mount as many devices along particular surfaces of the turbine blade in order to provide a great number of test points and hence accumulate enough data to assure that the blade will function properly during actual operation.

As seen in FIG. 1, there is a groove 11 which is implemented on the surface of the turbine blade 10. Located within the groove are a plurality of pressure transducers which serve to monitor the operation of the device during a test procedure.

Before proceeding with a further explanation of the invention, the following information is believed to be pertinent. Essentially, such turbine blades or other high velocity three-dimensional structures are fabricated from metallic materials such as stainless steel. This material is required due to the nature of operation of such devices and in order to assure long mechanical life. Essentially porcelain enamels are used to protect the steel and other metals which are employed for example in turbine blades. These ceramic materials are glasses which are specially designed to have thermal expansions which essentially serve to match the base metal and to mature (as to become glassy) at temperatures low enough to prevent distortion of the underlying metal material.

Hence, the use of porcelain enamels in conjunction with turbine blades is well known and there are many techniques implemented to provide glazes on such metal substrates As is well understood, the essential raw material utilized in such ceramics is clay. The clay is a hydrated compound of aluminum and silicon containing certain foreign matter such as ferric oxide, silica, calcium carbonate and so on. Porcelain on the other hand possesses a glass-like or vitreous surface and is not particularly porous. Porcelain is made by mixing clay with some powdered feldspar material, potassium aluminosilicate.

Essentially, what occurs is that at the temperature of firing the feldspar undergoes a gradual change from the crystalline to the glassy state and the rate depending upon the time of heating and the temperature to which it is subjected. In any event, techniques for forming ceramic surfaces on base metal materials such as stainless steel are well known. See for example a text entitled "Ceramics for Advanced Technologies" by J. E. Hove and W. C. Riley, published by McGraw Hill Co. of New York, 1965.

As indicated, there are many techniques which are utilized for forming a ceramic or glazed surface on the surface of a base metal material such as stainless steel. These techniques are utilized to coat the surfaces of turbine blades and other high speed rotating or high speed operating metal structures in order to further protect the same from corrosive elements or from deleterious environments.

Thus, as will be explained, one aspect of the present invention is to utilize a groove which is formed in a base metal material such as stainless steel. The groove as well as the entire metal structure is then coated with a suitable porcelain or ceramic coating. The process to be described enables one to mount pressure transducers or other components below the surface of the turbine blade or structure and at the same time connect various wires to the device which wires are also buried within the layer of ceramic or enamel. In this manner the total surface contour of the articles such as the turbine blade is maintained as actually designed and the pressure or force measuring components are disposed beneath the surface together with the wires which couple those components to the suitable test measuring equipment.

Referring to FIGS. 2A–2H, there is shown a series of cross-sectional views indicative of the methods and apparatus performed in implementing this invention.

Figure 2A:
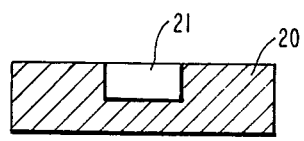
FIGS. 2A to 2H depict a series of method steps utilized in this invention for accommodating a pressure transducer or similar component within a recess formed in a turbine blade or article to be tested according to the techniques of this invention.

Referring to FIG. 2A, there is shown a metal substrate 20 which essentially constitutes a surface portion of the device to be tested such as a turbine blade and so on. As indicated above, the metal substrate 20 may be fabricated from stainless steel or any other metallic substance which is normally machined and designed to form the desired structure to be tested such as the turbine blade. Groove 21 is thus machined on a desired surface of the metal substrate 20. The groove 21 is of a length and width capable of accommodating a plurality of transducers such as pressure transducers of the miniature type.

Such pressure transducers are available in miniature forms from many commercial entities. An example of suitable pressure transducers which can be employed with this invention are available from a company called Kulite Semiconductor Products, Inc. of Ridgefield, N.J. This company supplies many miniature pressure transducers as well as accelerometers which can be employed with this invention.

Figure 2B:
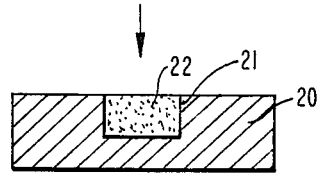

As indicated, the groove 21 is formed along a desired surface of the blade or device to be tested, and for example it would be similar to the groove 11 shown in FIG. 1. The groove 21 may be formed by many conventional mechanical machining processes such as grinding and so on. In any event, after formation of the groove 21 as shown in FIG. 2B, the groove is then filled with a suitable enamel or ceramic material As indicated, the ceramic material which is shown in FIG. 2B as 22 is the same type of material utilized to coat such turbine blades and such materials as well as the techniques for utilizing such materials are known in the prior art.

Essentially, the material 22 is a vitreous enamel which exists in the powder form. This powder form is then placed in an emulsion. It is then utilized to fill the groove 22 and then fired at a given temperature such as 825° C. by means of placing the object in a kiln. The material utilized would have a thermal coefficient of expansion which matches the thermal coefficient of expansion of the base metal substrate 20. Such ceramic materials for matching stainless steel and so on are well known in the art and many examples exist. See for example the above cited textbook. After the material 22 has been solidified by subjecting it to a high temperature, the entire surface of the base metal 20 is now again coated with another ceramic layer 23 utilizing the same techniques. This ceramic layer 23 is also cured at a given temperature.

Figure 2C:
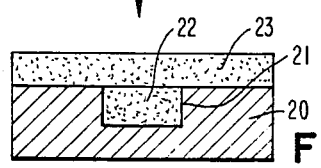
Figure 2F:
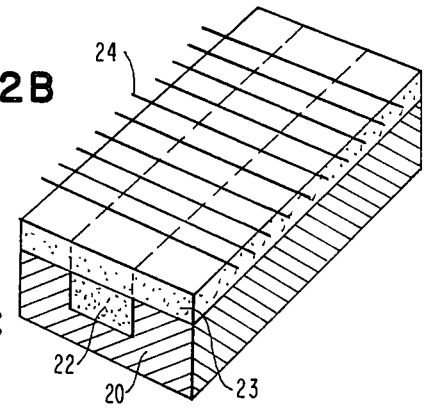
Figure 2D:
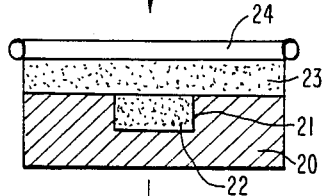

After forming the ceramic layer 23 on top of the filled groove 21 as shown in FIG. 2C, one then secures a series of wires 24 to the top surface of the ceramic layer 23. This is more clearly shown in FIG. 2F. Hence, as shown in FIG. 2F, a plurality of wires which are extremely small diameter wires are placed so that they actually cross the groove from end to end. These wires 24 are directed to various points such as the bottom of the turbine blade where they can be connected to test equipment.

As shown in FIGS. 2F, the wires 24 straddle the filled groove 21 and are placed on the top surface of the ceramic layer 23. The wires 24 may be gold wires of a 2 mil diameter. After emplacing the wires 24 on the top surface of the ceramic layer 23 as shown for example in FIGS. 2D and 2F, another ceramic coating 25 is then applied to the entire structure. The coating 25 serves to firmly secure the wires in place and essentially covers each wire and forms an additional coat for the base metal structure 20. This aspect is shown in FIG. 2E.

Figure 2E:
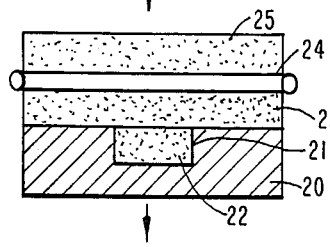
Figure 2G:
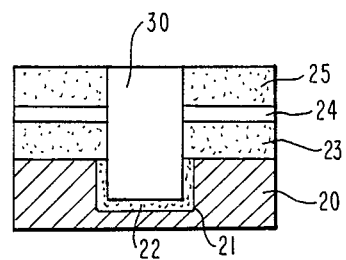

Referring to FIG. 2G, after the layer 25 is applied to the composite structure as for example shown in FIG. 2E, an aperture 30 is now formed or machined into the ceramic material. The aperture 30 essentially is an elongated channel and, as seen in FIG. 2G, operates to sever the wires on either side of the main channel 21. Thus, the formation of the aperture 30 serves to actually cut and separate the wires as shown in FIG. 2G while the aperture 30 has a bottom end which is directed into the channel 21 formed in the base metal structure 20.

Figure 2H:
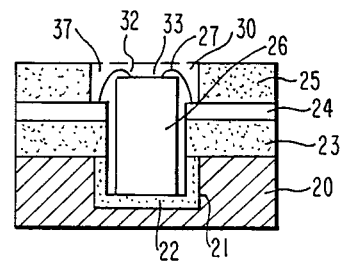

Referring to FIG. 2H, the following operations are then performed. A portion of the material from the ceramic layer 25 at each side of the channel 22 is removed so that the top surface of the wires 24 are exposed. A pressure transducer 26 is then inserted into the aperture 30 and may be secured to the bottom of the aperture 30 by means of a high temperature bonding material. The pressure transducer as indicated may be a piezoresistive device having a Wheatstone bridge or other sensing array mounted on a surface. The device 26 as inserted into aperture 30 has a plurality of terminals located on a surface thereof. These terminals such as 32 and 33 are then ball bonded to the exposed surfaces of the wire 24 to form a connection between the pressure transducer 26 and the appropriate wires.

In this manner the pressure transducer outputs as well as pressure transducer inputs are firmly bonded to the wires 24. After insertion of the pressure transducer 26 into the aperture 30, a compound such as a suitable RTV compound or other plastic 37 indicated by dashed lines is then utilized to fill the voids between the pressure transducer structure 26 and the apertures. The top surface is sanded or otherwise polished so that it (shown in dashed line) conforms to the top surface of the ceramic coating 25. Thus, based on the above, one now is able to ball bond or otherwise firmly secure wires from the pressure transducer terminals to the embedded wires as 24 as sandwiched between the ceramic layers 23 and 25.

Figure 3:
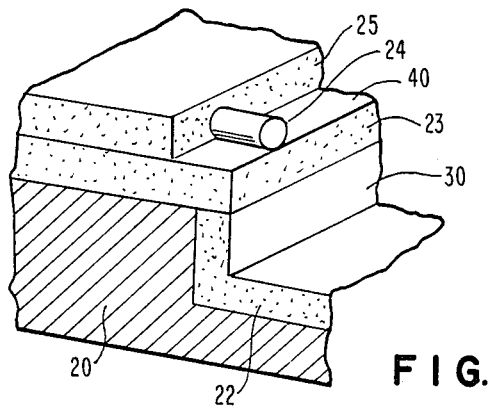
FIG. 3 is a partial cross sectional plan view of the apparatus formed by the method depicted in FIG. 2.

Referring to FIG. 3, there is shown a cross sectional plan view depicting the structure for example shown in FIG. 2H. As one can see from FIG. 3, the wire 24 essentially is exposed by the removal of excess material from the ceramic layer 25. The wire 24 was cut during the formation of the aperture 30 and now has its exposed surface resting upon a step 40 formed between ceramic layers 25 and 23. In this manner one can now ball bond the exposed surface of wire 24 to a suitable terminal of a pressure transducer 26 which is inserted into the cavity thus formed. It is, of course, understood that the length of the groove 21 is such that one can now stack pressure transducers along the groove, one adjacent the next.

The number of pressure transducers which can be accommodated in the groove is purely a function of the length of the groove as well as the number of wires which are placed across the channel as for example shown in FIG. 2F. The above technique thereby enables one to mount a pressure transducer within a cavity formed on a surface of a metal base material which material for example forms a turbine blade. By the use of the ceramic layers, wires are embedded between two ceramic layers and eventually are cut through after the ceramic layers are formed. Once the wires are severed, one can now access the top surfaces of the wires which enables one to then provide a ball bonding or other technique to couple the transducer terminals to the associated wires. The wires as directed across the machined groove can be located in any desired patterns in order to enable one to make contact to the various transducer structures used in testing the operation of the convoluted three-dimensional metal structure 20.

It is, of course, understood that the width of the groove for example as 21 may for example be a few hundred mils. As indicated above, the diameter of the wire as 24 is extremely small and hence the above described techniques alleviate many typical problems which normally would be associated with conventional approaches to the problem.

As one can ascertain, the formation of the groove 21 as for example shown in FIG. 2A would not be sufficient to accommodate the pressure transducer directly. The reason for this is that one experiences great difficulty in glazing or otherwise coating sharp corners of various grooves with ceramic material. This approach results in the shorting out of various wires and so on and essentially is not a reliable technique.

As one can ascertain, the above-described method assures a complete conformation of the profile of the turbine blade due to the nature of the ceramic layers while further firmly anchoring the wires in such a manner that they are absolutely undisturbed during turbine operation. Furthermore, one can access the surfaces of the wire by a simple machining operation such as an abrading technique. This enables the exposed surfaces of the wire to be directly ball bonded to the terminals of the pressure transducer. The ball bonding affords an extremely reliable joint which enables the entire unit to withstand the high gravitational forces imposed upon the turbine blade during operation as well as the various temperature cycling operations.

The use of the ceramic layers also assures that critical temperatures will not be exceeded which temperatures might adversely affect the qualities of the turbine blade. In this manner one can now couple and accommodate a great number of pressure transducer within the machined channel and assure that all transducers are properly directed to test equipment as well as to biasing sources by means of the wires as 24 which are emplaced between the ceramic layers.

What is claimed is:

1. A method for mounting components on a convoluted three-dimensional structure, comprising the steps of:
    forming a groove on a surface of said structure,
    coating said structure including said groove with a first layer of ceramic material,
    placing conductors on said first layer of ceramic material so that they overlie and span said groove,
    coating said structure including said first layer and conductors with a second layer of ceramic material to embed said conductors between said first and second layers,
    forming a second groove in said first and second layers which overlies said first groove and which extends into the same to separate said conductors as overlying said first groove,
    removing ceramic material from said second layer on each side of said second groove to expose the separated end surfaces of said conductor,
    placing a component having terminals within said second groove and bonding said component terminals to said exposed conductor surfaces.

2. The method according to claim 1, wherein said step of coating said first layer includes first filling said groove with said ceramic material and then coating said entire structure including said filled groove with a first layer of ceramic material.

3. The method according to claim 1, wherein said ceramic material has a thermal coefficient of expansion compatible with the thermal coefficient of expansion of said structure.

4. The method according to claim 1, wherein said three-dimensional structure is a metal turbine blade.

5. The method according to claim 1, wherein said component is a semiconductor pressure transducer.

6. The method according to claim 1, including the further steps of filling said second groove with a plastic compound after the step of bonding.

7. The method according to claim 1, wherein said conductors are wire conductors.

8. The method according to claim 1, wherein the step of bonding includes ball bonding said component terminals to said conductor surfaces.

9. The method according to claim 1, wherein said ceramic is a vitreous enamel of a powdered form wherein an emulsion is formed and coated on said surfaces prior to baking said emulsion in a kiln.

10. A method for mounting components on a convoluted three-dimensional metal structure, comprising the steps of:
    forming a first aperture on a surface of said metal structure,
    filling said aperture with a ceramic material,
    coating said metal structure including said surface and said filled aperture with a first layer of ceramic material,
    placing conductors on said coated surface so that said conductors overlie and span said aperture,
    coating said metal structure including said conductors with a second layer of ceramic material to embed said conductors between said first and second layer,
    forming a second aperture in said first and second layers overlying said first aperture and extending into the same to separate said conductors as overlying said first aperture,
    removing ceramic material from said second layer on each side of said second aperture to expose the separated end surfaces of said conductors,
    placing a component having component terminals within said second aperture, and
    bonding said component terminals to said exposed conductor surfaces.

11. The method according to claim 10, wherein said first aperture is an elongated groove adapted to accommodate a plurality of components.

12. The method according to claim 10, wherein said ceramic material has a thermal coefficient of expansion compatible with the thermal coefficient of expansion of said metal.

13. The method according to claim 10, wherein said metal structure is a turbine blade fabricated from a stainless steel.

14. The method according to claim 10, wherein said conductors are wires placed on said coated surface.

15. The method according to claim 10, wherein said component is a pressure transducer.

16. The method according to claim 10, wherein said step of bonding includes ball bonding said component terminals to said exposed conductor surfaces.

17. The method according to claim 10, including the step of filling said second aperture with a plastic compound after the step of bonding and smoothing said filled surface.

18. The method according to claim 15, wherein said wires are gold wires.

19. The method according to claim 10, wherein said ceramic is an enamel material.

20. The method according to claim 10, wherein a plurality of components are placed in said aperture.

* * * * *